United States Patent [19]

Fitzpatrick et al.

[11] 4,278,022

[45] Jul. 14, 1981

[54] PHOTOGRAPHIC IMAGE PAINTING PROCESS

[76] Inventors: John A. Fitzpatrick; Susan B. Fitzpatrick, both of 7335 Craner Ave., Sun Valley, Calif. 91352

[21] Appl. No.: 61,561

[22] Filed: Jul. 27, 1979

[51] Int. Cl.³ .............................................. B41F 17/22
[52] U.S. Cl. ..................................... 101/129; 427/282
[58] Field of Search ..................... 101/129, 115, 128.1, 101/128, 128.4, 127, 127.1; 427/143, 258, 259, 272, 282, 421; 400/210, 304

[56] References Cited

U.S. PATENT DOCUMENTS

| | | | |
|---|---|---|---|
| 1,987,593 | 1/1935 | Burgdorfer et al. | 101/129 |
| 2,444,860 | 7/1948 | Summer | 101/115 |
| 3,363,552 | 7/1968 | Rarey | 101/129 |
| 3,673,954 | 7/1972 | Lala | 101/115 X |
| 3,809,568 | 5/1974 | Askew et al. | 427/258 X |
| 3,943,851 | 3/1976 | Iwada et al. | 101/127.1 |

FOREIGN PATENT DOCUMENTS 768623  2/1957  United Kingdom ..................... 101/129

*Primary Examiner*—E. H. Eickholt
*Attorney, Agent, or Firm*—David O'Reilly; Donald M. Cislo

[57] ABSTRACT

A method of painting a photographic image on any surface, including a vertical surface or uneven surface. The method described is comprised of transferring the photographic image to a screen having a particular minimum mesh and then securing the screen to the surface onto which the photographic image is to be painted. The screen being flexible is secured to the surface in intimate contact and following substantially the contour of the surface to be painted. Paint is then sprayed through the photographic image on the screen in a series of applications of very thin layers with the paint allowed to dry between each application. The paint is mixed to such a consistency that it will rapidly dry almost as it is applied. When the painting is finally completed, the screen is removed by carefully peeling it from the surface, leaving the photographic image painted on the surface.

6 Claims, No Drawings

PHOTOGRAPHIC IMAGE PAINTING PROCESS

BACKGROUND OF THE INVENTION

This invention relates to transferring of images, and more particularly relates to a method of transferring a photographic image by painting.

No method now known has been available for transferring a photographic image to a vertical or somewhat uneven surface or to the underside of a horizontal surface, such as a ceiling. The silk screening process is usually used for transferring such images, but is limited to horizontal application on substantially flat surfaces. In the silk screening process, a silk screen is formed having a design impressed on a special cloth screen and the screen stretched across a rigid frame. The non-printing areas are blocked out and ink, which is usually paint rather than ink, is carried in the same frame. The ink is carried across the screen with a squeegie, which squeezes the ink through the screen through a platte surface beneath. Printing is usually done in flat, opaque colors, one color at a time. The fact that the screen is stretched across the rigid frame and the ink is squeegied through the open areas of the screen, prevents application to uneven or curved surfaces, or even the use on vertical surfaces, the underside of horizontal surfaces, or to soft surfaces such as cake frosting.

Further, it is impossible to spray paint in any useful quantity through screens of mesh size suitable for standard silk screening. Likewise conventional silk screening would fail with a mesh size sufficiently coarse to allow painting as the ink would run through like a sieve, smearing the image.

SUMMARY OF THE INVENTION

The purpose of the present invention is to allow transfer of photographic images to almost any surface, such as vertical, horizontal and/or uneven surfaces by a photographic painting process. In contrast to the silk screening process, the process of the present invention uses a screen having a particular mesh with the screen being directly secured to the surface being painted. With the method of the present invention, an exact likeness of a given photographic image, drawing or other physical image on the side of a vertical surface, such as a window pane or a truck panel, or other various vertical or horizontal surfaces, can be produced.

With a prepared film positive of the image to be reproduced or imprinted, a screen is made using a direct photo-emulsion process known in the art to a polyester or other suitable screen having a mesh opening per linear inch of about 74 or a similar grade. After developing, the screen is hardened in a conventional manner and allowed to dry. During the development of the screen it is usually secured to a frame. After development it is then cut from its frame and the free piece of screen then trimmed to size, leaving a border of blocked screen around the image, sufficient to allow masking tape or some other method to be used to secure the screen in place on the surface to be imprinted. The screen is then overlaid on the surface to be imprinted and secured by masking tape in or close to intimate contact with substantial portions of the surface. Carefully affixed or secured in this manner the screen will allow printing or painting of an image on a curved surface without losing detail at the edges.

The area beyond the perimeter of the screen is masked so that no paint or dye will stain the undesired area. Preferably fast-drying paint is then sprayed against the surface of the screen with care being taken not to allow the paint to build up and run. Paint passes through the screen only in the desired areas with the paint being applied in several successive applications of thin layers and allowed to dry before each application. After the final layer is applied, the screen is carefully peeled from the surface, leaving an imprint of the image on the surface.

DETAILED DESCRIPTION OF THE PREFERRED EMBODIMENT

This invention is comprised of a process for imprinting photographic images on uneven, vertical or horizontal surfaces and can even be used for applying photographic images on such unlikely surfaces as a cake frosting or window glass. The process consists of preparing a film positive of the image to be imprinted and then producing a screen usually mounted in a frame using a direct photo-emulsion process on a polyester or other suitable screen having mesh openings on the order of 74 per linear inch or other similar grade. At least a mesh grade of 70 should be used with no more than 90 being preferred. As mesh becomes smaller, detail is enhanced, but the number of paint sequences increases for proper darkness (i.e. intensity). After developing the screen, it is hardened in a conventional manner and allowed to dry. The photo-emulsion process for producing the photographic image on the screen is also known in the art. The screen is produced while being stretched across a rigid frame and in this case the screen is then cut from its frame after the photographic image is completed and the screen is hardened. The screen, after being freed from the frame, is trimmed to a size which leaves a blocked border of screen around the image. This blocked border should be sufficient to allow securing the screen in place on the surface to be imprinted with masking tape.

The screen is laid against the surface to be imprinted and secured with masking tape so that it is in contact with the surface to be imprinted throughout the entire area of the photographic image. When carefully applied, it will allow printing around curved or uneven surfaces without losing detail at the edges. The area beyond the perimeter of the screen is masked in some fashion to prevent paint or dye or ink from staining the undesired areas.

A paint is then mixed with a suitable thinner so that it will be rapid drying. For example, an acrylic lacquer is thinned with approximately 150% pure acetone so that it will dry rapidly. The thinning also assures that in addition to the rapid drying, very thin layers of paint will be applied to the surface by means of compressed air techniques known in the art. By use of these compressed air techniques, the paint is sprayed against the surface of the screen in very thin successive layers to prevent buildup and running. The paint passes through the screen only where the photographic image has been reproduced. A layer of paint is sprayed against the surface of the screen and allowed to dry before the next successive layer is applied. Usually several layers of paint, two to four being preferred, will be necessary to produce an image of sufficient distinctiveness. The paint should be sprayed using equipment that produces a very fine atomization of the paint as the particles of paint must be very small to pass through the screen properly.

After the application of the final layer, the paint is allowed to dry and cure for a period of time, the masks are removed and the screen is carefully peeled away from the surface. The screen may then be thoroughly cleaned and will allow another image to be made. The image thus produced on the surface imprinted will bear an exact likeness to the black areas of the original film positive rendered in the particular color sprayed. For different colors, a separate screen for different portions of the image may be used and in this case proper registration is very important. It is also possible with the method disclosed herein to spray more than one color through a single screen, creating, for example, a row of words where the upper half of the letters are one color and the lower half are another. To spray more than one color through the same screen, portions of the screen not being painted through will be masked or blocked off. The method described above gives an exact likeness of a given photo or physical image having been reproduced on the side panel of trucks or vans, on vertical glass windows in place, or other various vertical surfaces.

It is important that the paint be applied in very thin coats to prevent running, but at no time may the paint be allowed to build up wet, as this will cause the paint to adhere to the rear of the screen where it will produce a noticeably different texture than a correctly applied image, and may even run along the back of the screen over areas not intended. Paint adhering to the back of the screen also may tear the emulsion from the screen when it is lifted. To avoid this, careful spraying in successive, thin coats of a rapid-drying thinned paint is necessary. To avoid running and wet buildup of paint, it is preferable to spray in two to four even coats, allowing adequate drying before the next coat. When the last coat is dry, the screen may be removed and cleaned. In order to provide a glossy image to a lacquer applied to the screen, misting of the image with a thinner may be done to smooth out the surface of the image. The misting is done with a lacquer thinner. Without misting with the lacquer thinner the image would be flat (without gloss) due to the rapid-drying action of the acetone mixed with the paint. However, better color brilliance is obtained if the image is sanded with grade 600 paper and coated with clear lacquer.

After a series of coats have been applied, and the screen removed and cleaned, it may be desirable to enhance the image by repeating the application of a second or more series of coats. This may be desirable because slight paint buildup on the screen will gradually lessen the amount getting through to the surface. For this reason it is preferable to clean the screen after each successive application of two to four coats. In order to reapply the screen after cleaning, it is necessary to provide some method to realign the screen over the initial image for the second and successive group of coats. To permit this, registration areas are provided in the screen so that the screen can be properly aligned with the image. One method of accomplishing this is to produce notches cut in the border of the screen which are left open to spray. With a piece of masking tape applied to the surface to protect it from the registration marks, paint sprayed through the notches will produce a paint mark on the piece of masking tape, allowing realignment of the screen. After cleaning of the screen, the notches in the screen are realigned with the paint markings on the masking tape where the paint was sprayed during the first series of coats. This alignment procedure is necessary in a half-tone image because of the regularity of dots.

On the line copy (not half-tone) the initial image can easily be seen through the screen and realignment may be by the visual adjustment of all areas of the screen before securing with masking tape to insure the near exact super-position of open areas of the screen with corresponding areas of the initial image. Because stretched screens will shrink after they are removed from the frame, particularly after rinsing in lacquer thinner which softens them, it is preferable to preshrink them before use by rinsing first.

Because the image is produced in a series of coats which may contain a printing of the mesh (areas covered by the threads of the screen in regular checkerboard fashion) it is preferable to allow a slight misalignment in second and successive placements of the screen to eliminate this mesh printing. With a 75 mesh (approximately) this misalignment or slight deviance would be on the order of 0.008 inches or less than 0.01 inches. This small distance can readily be seen because moving the screen from the exact placement causes the image to appear slightly lighter, due to the exposed unpainted areas. If image size must be precise, allowance should be made for shrinkage when the film positive is made.

It is important that the screen be close to intimate contact with the surface in order to get a good image. Places or areas where the screen slightly bulges or is lifted from the surface being imprinted will produce no printing of the threads or mesh as the spray is able to go around the threads somewhat. However, if the distance between the screen and the surface being imprinted is excessive, a fuzzy image of inferior quality may be produced analogous to being out of focus. Thus, to prevent this, the screen must be pulled snugly in all areas to minimize separation between the screen and the surface being imprinted. A convexly curved cylindrical surface is ideal because it assists in establishment of close contact with the screen and the surface to be imprinted.

The process of the present invention works well on a horizontal surface and even better on a vertical surface. In contrast, conventional silk screening is very difficult on a vertical surface such as a display window.

The process in a somewhat modified form can also be used on such unusual surfaces as frosted cakes, iced pastries or nearly any surface where a photographic image may be produced. For cake frostings the screen may be gently adhered to the surface to be imprinted and a spray comprised of a mixture of food coloring and corn syrup applied. To secure the screen to the frosted cake, it is gently pressed against the frosting. It is preferable that the frosting has a slightly tacky crust which can be formed by refrigeration for a short time. The screen with the image is lightly pressed onto the frosting taking care to insure intimate contact with the frosting.

The basic process of the invention is the same for an acrylic enamel paint as for an acrylic lacquer with some minor variations. The enamel is slower drying than the lacquer. Thus, the application of paint to achieve a very thin coat which will not run must proceed more slowly. Even though the enamel is thinned with acetone as is the lacquer, the drying will still be somewhat slower and application of the paint must proceed more slowly. Also, this requires waiting a little longer between groups of coats or applications of the enamel paint. With slight modification in technique, nearly any kind of paint may be used. Thicker-bodied paints may be applied somewhat more heavily due to their resistance to running. However, depending upon how slowly the paint dries, it may be necessary to wait up to twenty-four hours before re-shooting the image. The enamel paints may also be misted with a thinner to produce a gloss with less difficulty than the lacquer because of the slower drying and because an enamel paint flows somewhat better upon an application than acetone-thinned lacquer. The more slower-drying the paint, the more difficult are the applications, even if applied in very thin coats. Thus, the key to the method is the intimate contact of the screen with the surface to be imprinted; the application of the paint in thin coats to cause some image transfer with each coat; the prevention of buildup of wet paint to stick to the screen; and the removal of the screen after a series of coatings for cleaning and replacement and additional coatings as necessary.

Thus, with the process of the present invention, transfer of images to unusual surfaces not heretofore allowed, except by silk screening or handpainting, can be achieved. Further, since the screen is free of any rigid frame, the copy does not have to be oriented on the screen as it will appear. This allows utilization of more space on the screen to minimize unused space. Words may be squeezed together, for example, permitting more words on a screen than would be possible if exact final spacing of the words was necessary, as in conventional silk screening. Further, when the screen is being produced, more than one image may be formed on a given screen as particular images can easily be separated by cutting the screen into pieces.

Thus, there has been disclosed a novel method for painting photographic images on unusual or uneven surfaces not heretofore permitted by painting or silk screening techniques.

Obviously, many modifications and variations of the present invention are possible in light of the above teachings. It is to be understood, therefore, that the scope of the present invention is not to be limited to the details disclosed herein but may be practiced otherwise than as specifically described.

What is claimed is:

1. A method of imprinting a photographic image on a vertical or uneven surface comprising:
   transferring a photographic image to a screen having a predetermined minimum mesh, such screen being formed with a blocked border;
   forming registration areas in the form of notches in the border of said screen to allow realignment after removal and replacement;
   securing said screen to the surface to be painted with said screen in substantially intimate contact with and following the contour of the surface to be painted;
   spraying a rapid-drying paint through said screen on to the surface being imprinted in a series of layers, said paint being allowed to dry between applications of each layer;
   forming registration marks through said registration areas on the surface to be imprinted to facilitate realignment of said screen;
   removing said screen from said surface after a series of paint applications when the paint is dry;
   cleaning said screen after removal to remove paint; and
   replacing and realigning said screen with said registration areas for one or more additional series of paint applications whereby said photographic image is transferred to the surface desired.

2. The process according to claim 1 including:
   intentionally slightly misaligning said screen mesh in the photographic image transferred.

3. The process according to claim 1 including the step of spraying a fine mist of paint thinner after screen removal to impart a gloss to the image imprinted.

4. The process according to claim 1 wherein said paint is applied to said screen in a series of applications.

5. The process according to claim 1 wherein said registration marks are formed by spraying paint through the registration areas on tape adhered to the imprinted surface.

6. The process according to claim 2 wherein the misalignment of said screen is less than about 0.01 inch.

* * * * *